United States Patent
Caldwell et al.

[11] Patent Number: 5,575,136
[45] Date of Patent: Nov. 19, 1996

[54] DE-REELER FOR TAPE AND REEL MACHINE

[75] Inventors: Shirley Y. Caldwell, Sherman; Jerry M. Varley, Whitesboro, both of Tex.

[73] Assignee: Texas Instruments Incorporated, Dallas, Tex.

[21] Appl. No.: 369,020

[22] Filed: Jan. 5, 1995

[51] Int. Cl.⁶ .............................. B65B 43/40; B65B 7/28
[52] U.S. Cl. .............................. 53/492; 53/468; 53/477; 53/373.7; 53/381.1
[58] Field of Search ..................... 53/492, 381.1, 53/381.4, 389.2, 389.4, 118, 559, 468, 478, 477, 373.7

[56] References Cited

U.S. PATENT DOCUMENTS

| | | | |
|---|---|---|---|
| 4,525,982 | 7/1985 | Meier | 53/118 X |
| 4,604,852 | 8/1986 | Becker | 53/559 X |
| 4,753,061 | 6/1988 | Braden et al. | 53/559 X |
| 4,897,074 | 1/1990 | Knight | 53/559 X |
| 5,269,123 | 12/1993 | Marchesini | 53/559 |
| 5,390,472 | 2/1995 | Weiler et al. | 53/492 X |
| 5,448,874 | 9/1995 | Lemonnier | 53/492 X |

FOREIGN PATENT DOCUMENTS

| | | | |
|---|---|---|---|
| 828235 | 6/1979 | U.S.S.R. | 53/492 |

*Primary Examiner*—Horace M. Culver
*Attorney, Agent, or Firm*—W. James Brady, III; Richard L. Donaldson

[57] ABSTRACT

The invention is to an apparatus and method for re-working defective carrier tapes in which semiconductor devices are sealed in carrier tape by cover tape. A defective carrier tape (10) is moved through a track (16a) in a tape and reel machine (15). A defective cover tape (32a) is wound onto de-reel pulley (32) as it is removed from the carrier tape (10) through window (16b) in track (16a). A new cover tape (23) is applied to carrier tape (10) through window (16b) and is then sealed to carrier tape by heat elements (25). In the process, the carrier tape is unwound from a first reel (18) onto a second reel (19) without removing semiconductor devices from the carrier tape (10).

7 Claims, 5 Drawing Sheets

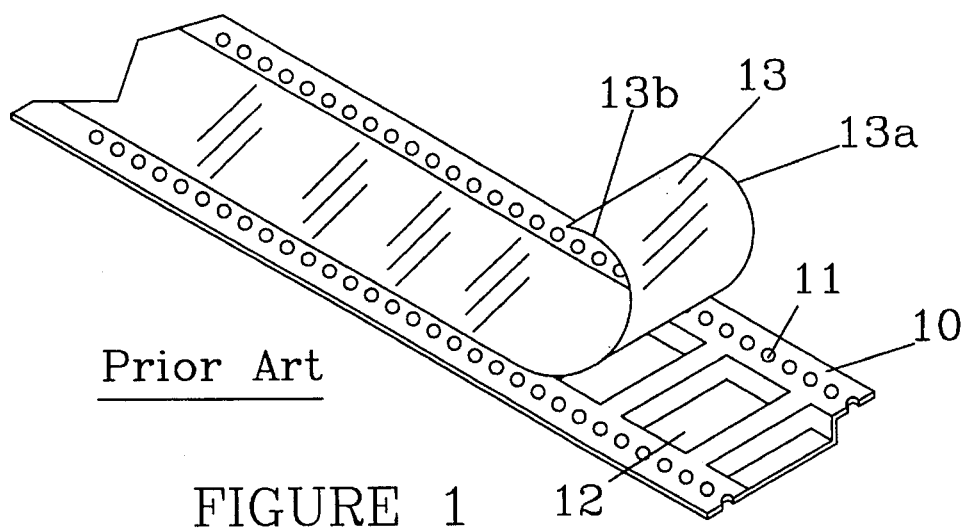
Prior Art
FIGURE 1
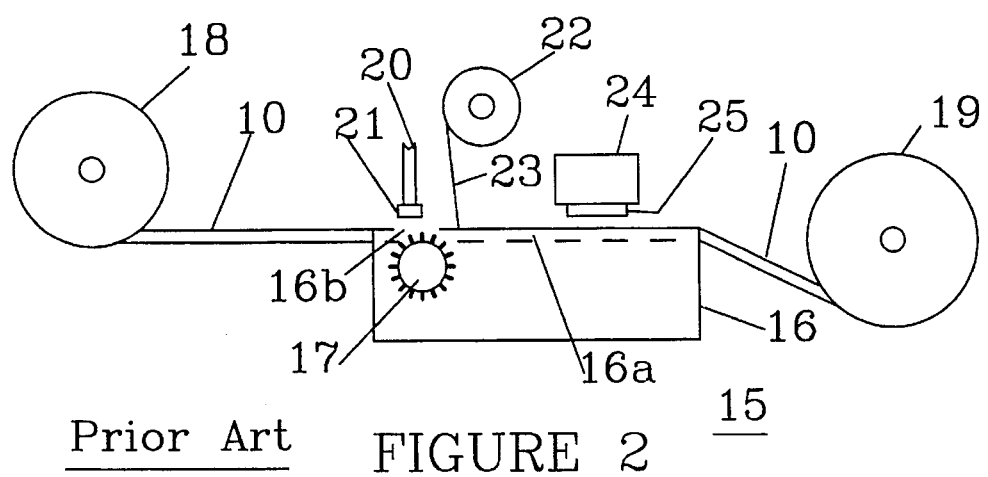
Prior Art   FIGURE 2

DE-REELER FOR TAPE AND REEL MACHINE

FIELD OF THE INVENTION

This invention relates to semiconductor processing equipment, and more particularly to a de-reeler device, used in conjunction with a tape and reel machine, to remove the cover tape cover from a tape carrier for semiconductor devices.

BACKGROUND OF THE INVENTION

Semiconductor devices are placed into continuous strips or reels of device carrier tape having recesses therein for holding semiconductor devices in a predefined orientation. A thin tape seals the semiconductor devices in the recesses in the carrier tape during shipping and prior to removing the devices when reels of such devices are used in automated production lines where the semiconductor devices have to be removed for testing or mounting on circuit board. In some instances, the cover tape becomes damaged or peels back from the tape. In this instance, the devices may fall out of the tape recesses, or the damaged tape may not be properly removable prior to testing of the devices or placement of the device on a printed circuit board.

When the cover tape becomes damaged, it has to be removed and/or devices have to be placed back into the recesses. Even though there is damage to the tape at only a few places, a defective reel of tape has to be cut into short strips. The tape and the semiconductor devices are removed manually by an operation, and put into a carrier tube or tray. After all the devices have been removed, they must be re-inspected for lead damage and then processed back through a tape and reel machine a second time. The hand removal and replacement of the devices is time consuming.

SUMMARY OF THE INVENTION

A de-reeler for a tape and reel machine includes a mounting bracket for securing the de-reeler to the tape and reel machine. A rotatable shaft has mounted thereon a tape reel and a first pulley wheel. A second pulley wheel is attached to sprocket wheel on said tape and reel machine, and turns the second pulley wheel with a belt between said first and second pulley wheels.

The technical advance represented by the invention, as well as the objects thereof, will become apparent from the following description of a preferred embodiment of the invention when considered in conjunction with the accompanying drawings, and the novel features set forth in the appended claims.

BRIEF DESCRIPTION OF THE DRAWINGS

FIG. 1 illustrates an example of a carrier tape and cover tape;

FIG. 2 is a pictorial representation of a tape and reel machine;

FIG. 7 illustrates the de-tape/re-tape process.

DESCRIPTION OF A PREFERRED EMBODIMENT

Figure 3:
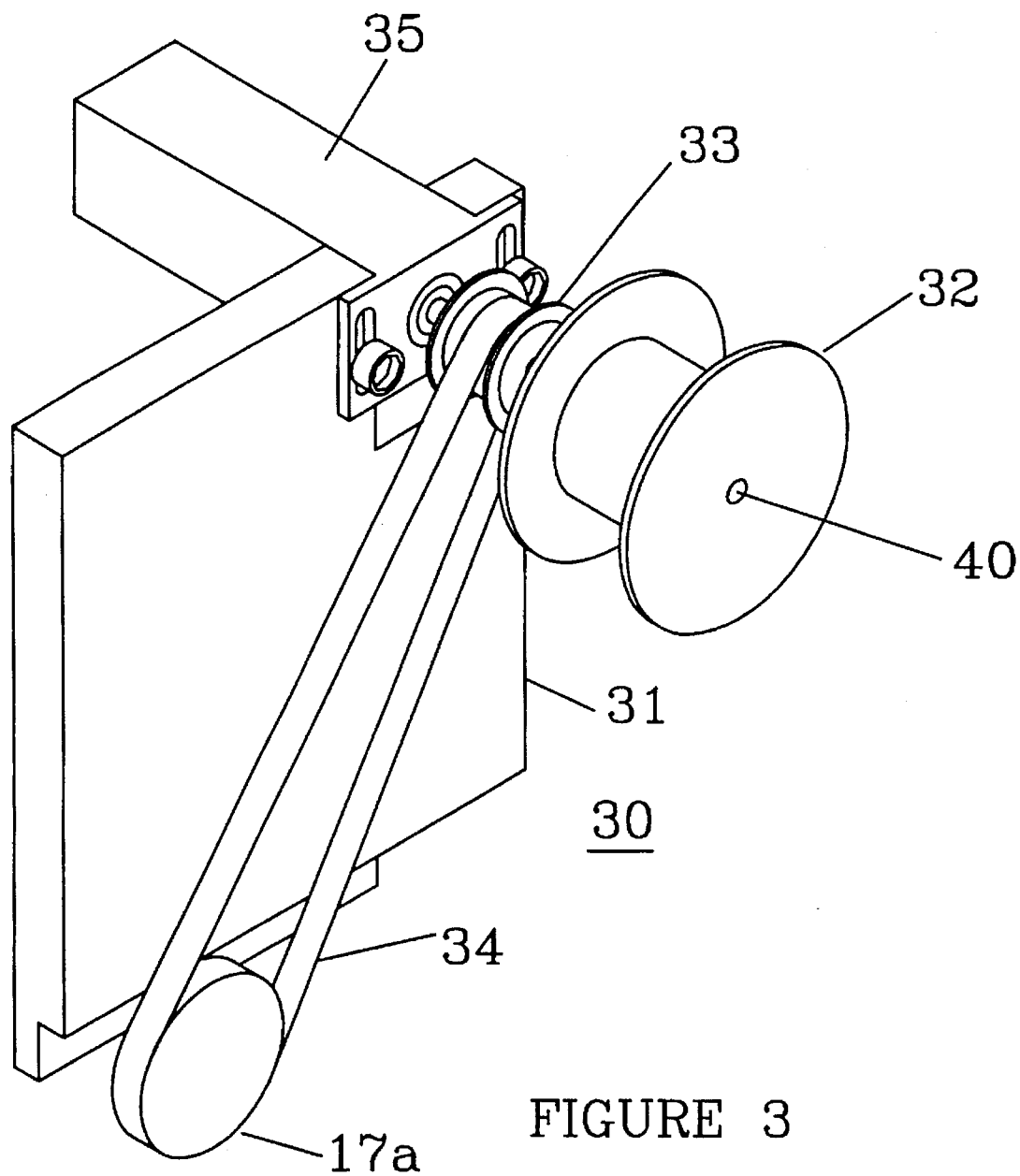
FIG. 3 is an isometric view of the tape de-reeler apparatus of the present invention.

FIG. 1 shows a typical carrier tape for semiconductor devices. Tape 10 has a series of indexing holes 11 on one or both sides of the carrier tape. There are a plurality of recesses 12 into which semiconductor devices (not illustrated) are placed. After placement, a tape 13 is sealed along its edges 13a and 13b to carrier tape 10 on each side of recesses 12.

FIG. 2 pictorially illustrates a Tape and reel machine 15 for placing semiconductor devices in recesses 12 of carrier tape 10. A carrier tape 10 is un-reeled from reel 18 and is passed through track 16a in base 16. Sprocket 17 indexes carrier tape 10 under pick tool 20 on which is held a semiconductor device 21. Pick tool 20 picks up by, for example, a vacuum, a device 21 and places it in a recess 12 in carrier tape 10. Track 16a has a window 16b through which the semiconductor device is placed on the carrier tape 10, and through which tape 13 is fed into track 16a over carrier tape 10. As reel 22 of tape 13 is unreeled, and placed over carrier tape 10, it passes under sealer 24, which has two parallel 25 elements which are heated, and seals tape 23 over carrier tape 10. The heat and pressure seals tape 23 to carrier tape 10. The sealed carrier tape and devices are then reeled onto tape reel 19.

When cover tape 13 becomes damaged, or becomes unsealed along its edges 13a and 13b from carrier tape 10, it is desirable and usually necessary to cut carrier tape into strips, remove the devices and remount the devices in a new carrier tape. This is not necessary with the present invention.

FIG. 3 is an isometric view of tape de-reeler 30 that is used in conjunction with tape and reel machine 15. The de-reeler 30 is used to re-work defective reels by removing defective cover tapes and replacing it with a new cover tape. De-reeler 30 includes mounting plate 31 which is attached to base 16 of tape and reel machine 15 with pulley 17a axially in line with and attached to the back of sprocket wheel 17.

Spool 32 and sprocket 33 are on a common shaft 40 secured in mount 35. A ribbed drive belt 34 drives sprocket 33 from ribbed pulley 17a which is driven by main sprocket wheel 17.

Figure 4:
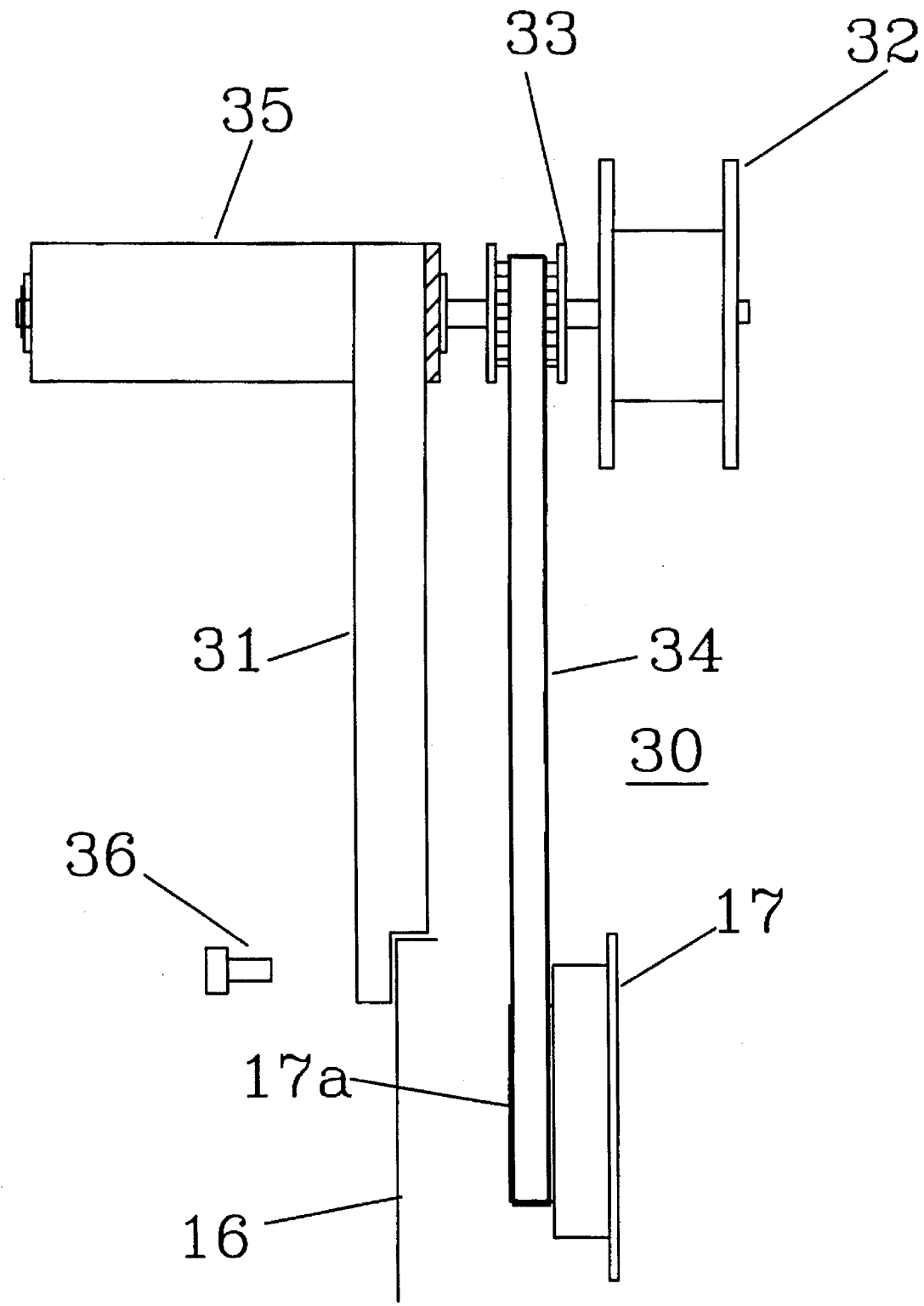
FIG. 4 is side view of the tape de-reeler.

FIG. 4 is a side view of tape de-reeler 30 showing mounting plate 31 attached to housing 16 by two screws (FIG. 5) 36 and 37. Ribbed belt 34 is mounted around pulley 17a and sprocket 33, and turns de-tape spool 32 in synchronism with main drive sprocket wheel 17. Main sprocket wheel 17 advances carrier tape 10 FIG. 2), and de-tape spool 32 in synchronism with the movement of carrier tape 10 (FIG. 2).

Figure 5:
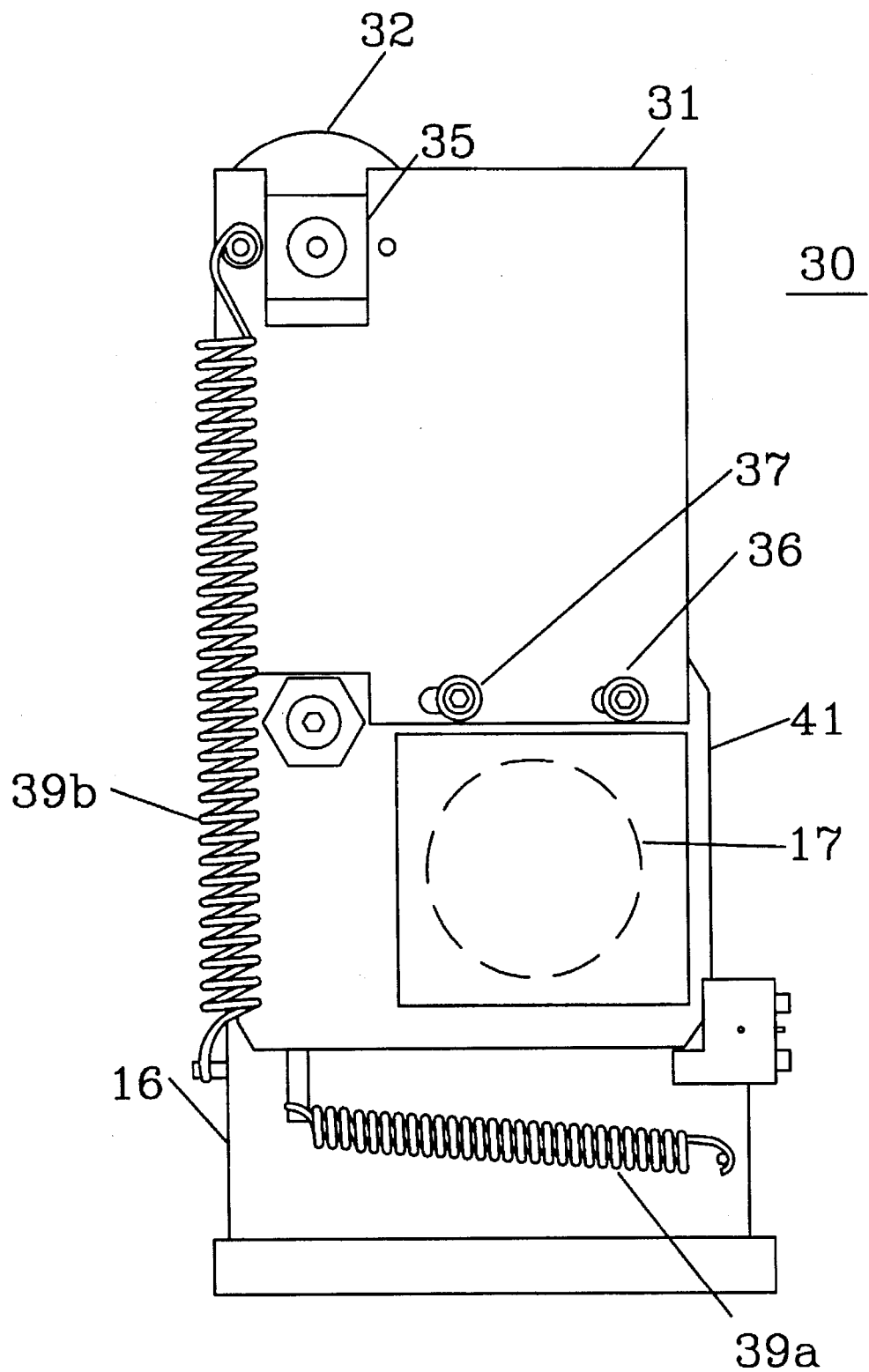
FIG. 5 is front view of the tape de-reeler.

FIG. 5 shows a front of view de-reeler 30, showing mounting plate 31 secured to the housing 16 or the tape and reel machine 15. Main drive sprocket wheel 17 is shown in dashed lines behind stepper motor cover 41. Spring 39a is connected between housing 16 and stepper motor cover 41 and spring 39b is connected between housing 16 and mounting plate 31 to ensure that the drive sprocket wheel 17 fully engages the index holes 11 in carrier tape 10 (FIG. 1).

Figure 6:
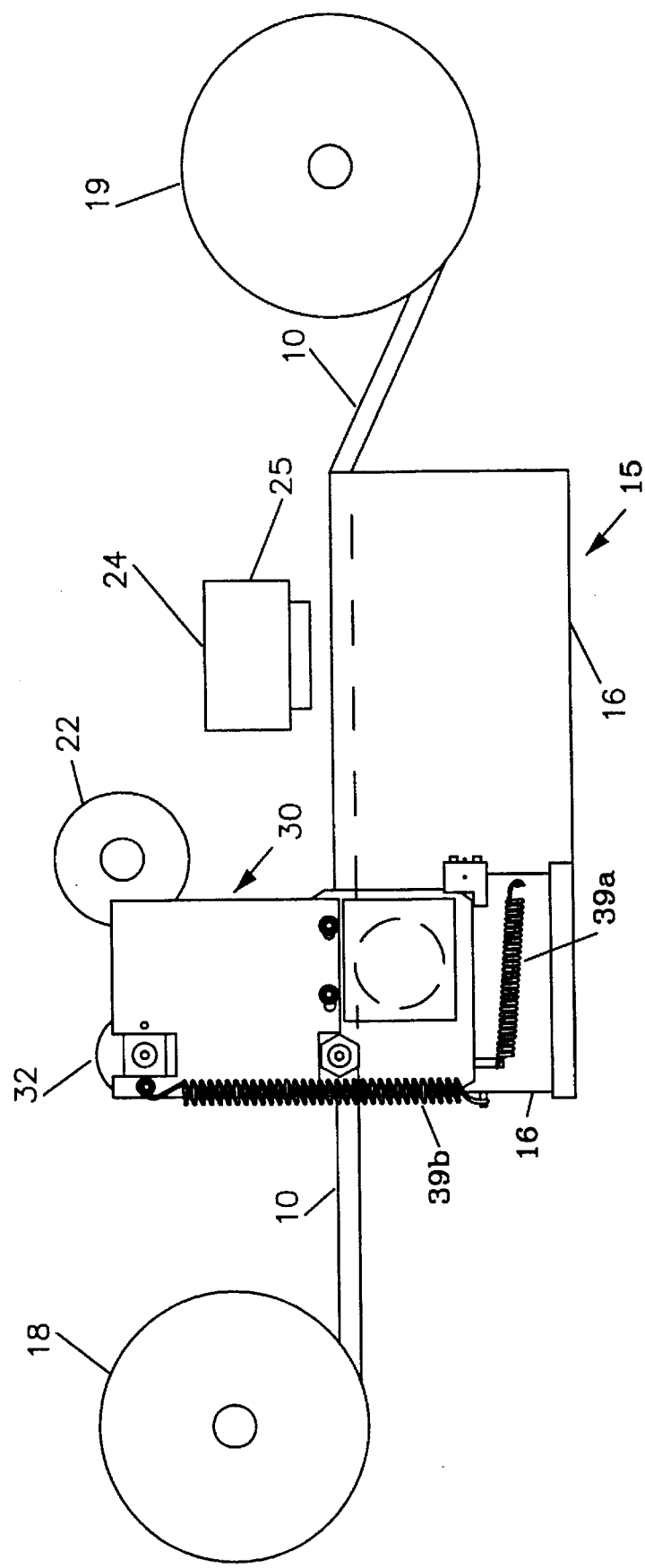
FIG. 6 is pictorial view of the tape and reel machine and tape de-reeler.

FIG. 6 shows the Tape and reel machine with the de-reeler 30 attached to housing 16 of the tape and reel machine 15. Reel 32 on which is wound the removed tape 23a (FIG. 7) is positioned to the left (as shown in FIG. 6) of tape reel 22. The operation of the de-reeler 30 in conjunction with the Tape and reel machine 15 is pictorially illustrated in FIG. 7.

In FIG. 7, reel 18 of defective cover tape carrier tape 10 is fed into Tape and reel machine 15, only partially shown.

Tape 10 is inserted into track 16a and the defective tape 32a is pulled through window 16b and attached to reel 32. A new tape 23 is secured to the top of tape 10 and is pulled into track 16a, and under sealer 24, having heated parallel elements 25, which seals new tape 23 to carrier tape 10. The re-sealed tape 10 is then stored on reel 19. Pick tool 20 is positioned above window 16b and prevents device 50, in carrier tape 10, from being displaced from recess 12, when tape 23 is pulled from carrier tape 11.

The tape de-reeler, used in conjunction with the tape and reel machine, eliminates manual handing of the damaged taped reels and can, depending upon the semiconductor pin type, re-tape 4 to 5 reels of about 2500 units in an hour.

What is claimed:

1. Method for re-working defective carrier tapes in which semiconductor devices are sealed in a carrier tape by a cover tape, comprising the steps of:

advancing a defective carrier tape through a track with a drive mechanism;

removing a defective cover tape from the carrier tape with a de-reeler tape reel rotated by said drive mechanism in synchronism with the advancing of the defective carrier tape through said track;

supplying a new cover tape to the carrier tape with a cover tape reel; and sealing said new cover tape to said carrier tape in said track.

2. Tape and reel machine for removing a first cover tape from a semiconductor device carrier tape and replacing the removed cover tape with a second cover tape; comprising:

a housing for the tape and reel machine a first tape reel holding carrier tape with cover tape thereon;

a second tape reel for receiving the carrier tape from said first tape reel;

a track in said housing through which said carrier tape moves from said first tape reel to said second tape reel;

a cover tape reel for supplying cover tape to be sealed to said carrier tape; and a de-reeler tape reel for receiving the cover tape removed from said carrier tape prior to the application of said cover tape applied to said carrier tape from said cover tape reel.

3. The combination according to claim 2, wherein said track in said housing includes an opening through which said de-reeler tape reel receives tape removed from said carrier tape, and through which said cover tape from said cover tape reel is applied to said carrier tape.

4. The tape and reel machine according to claim 2, including heat sealer for sealing said cover tape to said carrier tape.

5. The tape and reel machine according to claim 2, including pick tool positioned above said opening in said track for placing semiconductor devices in said carrier tape.

6. The tape and reel machine according to claim 2, wherein said de-reeler tape reel is on a rotatable shaft mounted on a bracket for securing the de-reeler tape reel to the tape and reel machine.

7. The tape and reel machine according to claim 6, where said de-reeler tape reel is part of a de-reeler assembly mounted on said bracket, comprising:

a rotatable shaft attached to said bracket;

a first pulley wheel on said rotatable shaft;

said de-reeler tape reel mounted on said rotatable shaft;

a second pulley wheel attached to sprocket wheel on said tape and reel machine; and a belt between said first and second pulley wheels for turning said first pulley.

\* \* \* \* \*